US007125745B2

United States Patent
Chen et al.

(10) Patent No.: US 7,125,745 B2
(45) Date of Patent: Oct. 24, 2006

(54) MULTI-CHIP PACKAGE SUBSTRATE FOR FLIP-CHIP AND WIRE BONDING

(75) Inventors: Kun-Ching Chen, Tainan (TW); Yi-Chuan Ding, Kaohsiung (TW); Po-Jen Cheng, Kaohsiung (TW); Chih-Ming Chung, Kaohsiung (TW); Yun-Hsiang Tien, Fengshan (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 79 days.

(21) Appl. No.: 10/833,087

(22) Filed: Apr. 28, 2004

(65) Prior Publication Data

US 2004/0212088 A1    Oct. 28, 2004

(30) Foreign Application Priority Data

Apr. 28, 2003  (TW) ................. 92110101 A

(51) Int. Cl.
  *H01L 21/44*    (2006.01)
(52) U.S. Cl. ............. 438/108; 438/613; 438/E23.02
(58) Field of Classification Search ............ 257/777, 257/778, 723, 737, 738; 438/106, 108, 612, 438/613, 617
See application file for complete search history.

(56) References Cited

U.S. PATENT DOCUMENTS 6,157,080 A    12/2000  Tamaki et al. ........... 257/738
6,353,263 B1 *  3/2002  Dotta et al. ............. 257/777
6,777,796 B1 *  8/2004  Fujimoto et al. ......... 257/686
6,781,221 B1 *  8/2004  Yoneda .................. 257/678

FOREIGN PATENT DOCUMENTS

CN    TW515061    12/2002

\* cited by examiner

*Primary Examiner*—Roy Potter
(74) *Attorney, Agent, or Firm*—Troxell Law Office, PLLC

(57) ABSTRACT

A multi-chip package substrate for both flip-chip bumping and wire-bonding applications comprises a substrate body having a top surface and a bottom surface. A plurality of bumping pads and a plurality of wire-bonding pads are formed on the top surface. The bumping pads are disposed on the top surface of the substrate body and a pre-solder material is formed on the bumped pads. The wire-bonding pads are disposed on the top surface of the substrate body and a Ni/Au layer is formed on the wire-bonding pads. In order to avoid the bumping pads and the wire-bonding pads from oxidation during packaging processes. The pre-solder material fully covers the bumping pads to avoid the Au intermetallics generated in a plurality of bumps on a bumped chip during packaging processes. The reliability of the multi-chip stacked package for both flip-chip bumping and wire-bonding applications will be greatly improved.

4 Claims, 4 Drawing Sheets

MULTI-CHIP PACKAGE SUBSTRATE FOR FLIP-CHIP AND WIRE BONDING

FIELD OF THE INVENTION

The present invention relates to an integrated circuit package substrate, particularly to a multi-chip package substrate for both flip-chip bumping and wire bonding applications.

BACKGROUND OF THE INVENTION

In the conventional multi-chip package, a plurality of chips are electrically connected to a substrate by means of flip-chip bumping and wire-bonding technologies, the chips includes a bumped chip and a wire-bonding chip that are stacked back-to-back. A multi-chip stacked package 100 is disclosed in U.S. Pat. No. 6,157,080. Referring to FIG. 1, the multi-chip stacked package mainly includes a substrate 110, a bumped chip 120, a wire-bonding chip 130, a package body 160 and a plurality of solder balls 170. The substrate 110 has a plurality of bumping pads 111 and a plurality of wire-bonding pads 112 formed on the top surface of the substrate 110. The bumped chip 120 is flip-chip mounted to the bumping pads 111 of the substrate 110 via a plurality of bumps 140. The wire-bonding chip 130 is attached to the back surface of the bumped chip 120. And a plurality of bonding pads of the wire-bonding chip 130 are further electrically connected to the wire-bonding pads 112 of the substrate 110 by a plurality of bonding wires 150. After electrical connection, the package body 160 is formed on the top surface of the substrate 110 in order to encapsulate the bumped chip 120 the wire-bonding chip 130, the bumps 140 and the bonding wires 150. The solder balls 170 are placed on the bottom surface of the substrate 110. However, the oxidization-resistance structures of the bumping pads 111 and the wire-bonding pads 112 on the substrate 110 are not shown. Normally a reflow step is performed after flip-chip assembly prior to wire bonding. When the wire-bonding pads 112 or the bumping pads 111 are oxidized during packaging processes, the electrical connection of the bonding wires 150 or the bumps 140 are hard to bond to the wire-bonding pads 112 or the bumping pads 111, as the results, the productivity and yield will decrease.

Another conventional structure of contact pad of the package substrate is disclosed in R.O.C. Taiwan Patent No. 515,061 entitled "Ni/Au electroplating process and structure for electrical contact pads of chip package substrate". In order to protect the contact pads of the substrate, the exposed surfaces of the contact pads are plated with a Ni/Au layer so as to protect the contact pads from oxidation during packaging processes. However, the contact pads with plated Ni/Au layer are only for the connection of the Au bonding wires. However, when the solder bumps of the bumped chip are bonded to the Ni/Au layer, the embrittlement of Au will easily happen.

In the foregoing package substrate, when a plurality of bumping pads and a plurality of wire-bonding pads are simultaneously formed on the same surface of the substrate for assembling a back-to-back multi-chip package. The bumping pads are also electroplated with a Ni/Au layer, the solder bumps and the Ni/Au layer on the bumping pads can trigger Au embrittlement during the solder bumps reflow process. Initially, Au element of the Ni/Au layer on the outermost surface will migrate into the solder bumps extremely fast. After complete reaction of the Au layer, then the Ni layer begins to react with the solder bumps to form a pin-shaped $Ni_3Sn_4$ intermetallic layer, and the Au element enters the solder bumps to form a $(Au_{1-x}Ni_x)Sn_4$ intermetallic layer at the bonding interface after reflow. The $(Au_{1-x}Ni_x)Sn_4$ intermetallic layer is unstable so that it will accumulate at the bonding interface of the bumps of bumped chip and bonding pads of the substrate. The $(Au_{1-x}Ni_x)Sn_4$ intermetallic layer will expand gradually until the whole bonding interface is covered. The $(Au_{1-x}Ni_x)Sn_4$ intermetallic layer is fragile so that the bonding interface will easily crack, that is so-called Au embrittlement. Especially, the area of the bumping pads is smaller than the area of the conventional solder ball pads, since the bumping pads are used to mount the bumps of the bumped chip, not solder balls for BGA packages. The Au concentration in the bumps will be higher than that in the conventional solder balls where the Ni/Au electroplated layer is supposed to be the same thickness on the bumping pads and on the solder ball pads. Therefore, the reliability of the packaging body is seriously affected due to too much $(Au_{1-x}Ni_x)Sn_4$ intermetallic in the bumps.

SUMMARY

The primary object of the present invention is to provide a multi-chip package substrate for both flip-chip bumping and wire-bonding applications. In order to avoid Au embrittlement and oxidation on the bumping pads and the wire-bonding pads, a pre-solder material is formed on the plurality of bumping pads and a Ni/Au layer is formed on the wire-bonding pads. Since the pre-solder material is different from the Ni/Au layer so that Au embrittlement during packaging process can be avoided, therefore, the reliability of multi-chip stack package for both flip-chip bumping and wire-bonding applications can be greatly enhanced.

The second object of the present invention is to provide a multi-chip package including a substrate. The substrate has a plurality of bumping pads and a plurality of wire-bonding pads on the same surface, wherein the wire-bonding pads are arranged around the bumping pads for wire bonding back-to-back stacked chips. A pre-solder material is formed on the bumping pads for connection of a bumped chip, and a Ni/Au layer is formed on the wire-bonding pads for wire-bonding connection after reflowing the bumps.

In accordance with the present invention the multi-chip stack package substrate for both flip-chip bumping and wire-bonding applications includes a substrate body having a top surface and a bottom surface. The substrate body has a plurality of bumping pads and a plurality of wire-bonding pads formed on the top surface. A pre-solder material is formed on the bumping pads to protect the bumping pads from oxidation and Au embrittlement during packaging processes, especially after reflowing the bumps. The bumping pads of the substrate body are used to connect the bumps of the bumped chip. A Ni/Au layer is formed on the wire-bonding pads to protect the wire-bonding pads from oxidation during packaging processes, the wire-bonding pads are used for electrical connection of a wire-bonding chip to the substrate body via bonding wires. Therefore, the reliability of multi-chip stack package for both flip-chip bumping and wire-bonding applications can be improved.

DETAILED DESCRIPTION OF THE PRESENT INVENTION

Figure 1:
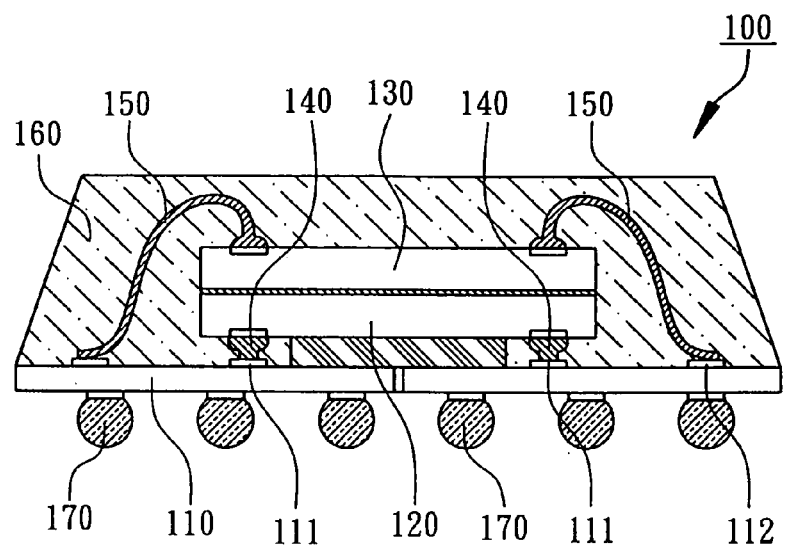
FIG. 1 is a cross-sectional view of a conventional multi-chip package.

Referring to the drawings attached, the present invention is described by means of the embodiments below.

Figure 2:
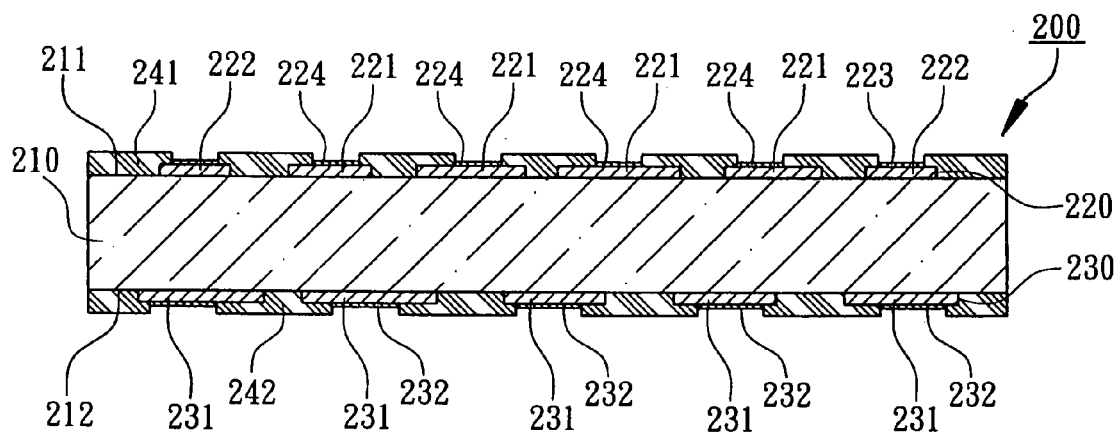
FIG. 2 is a cross-sectional view of the multi-chip package substrate for both flip-chip bumping and wire-bonding applications in accordance with the embodiment of the present invention.

Referring to FIG. 2, the multi-chip package substrate 200 for both flip-chip bumping and wire-bonding applications comprises a substrate body 210 having a top surface 211 and a bottom surface 212. There are a top circuit layer 220 and a top solder mask layer 241 formed on the top surface 211. The top circuit layer 220 includes a plurality of bumping pads 221 and a plurality of wire-bonding pads 222 that are exposed from the top solder mask layer 241. The bumping pads 221 are made from a metal conductive layer, such as copper or copper alloy, can be used as the first bonding pads of the substrate 200 for flip chip bumping. The bumping pads 221 are disposed in grid array on a defined flip-chip region of the top circuit layer 220. A pre-solder material 224 is formed on the bumping pads 221 to prevent oxidation during packaging processes and Au embrittlement of flip-chip bumps. The wire-bonding pads 222 are also made from the same metal conductive layer which are used as the second bonding pads of the substrate 200 for wire bonding a wire-bonding chip. The wire-bonding pads 222 are disposed around the bumping pads 221 out of the flip-chip region. A Ni/Au layer 223 is formed on the wire-bonding pads 222 to prevent oxidation. Preferably, the pre-solder material 224 fully covers the bumping pads 221 to be used as a wetting layer for the bumps of the bumped chip and to prevent Au embrittlement on the bumping pads 221. This is because no Ni nor Au is on the bumping pads 221 to form $(Au_{1-x}Ni_x)Sn_4$ intermetallics. Therefore, the reliability of the multi-chip package for both flip-chip bumping and wire-bonding applications can be improved. It is better that a bottom circuit layer 230 and a bottom solder mask 242 are disposed on the bottom surface 212 of the substrate body 210. The bottom solder mask 242 exposes a plurality of ball pads 231 on the bottom circuit layer 230. Normally the ball pads 231 are in a circle shape and larger than the bumping pads 221. Besides, a protective film 232 is formed on the ball pads 231 to prevent oxidation during packaging processes, wherein the protective film 232 may be Ni/Au layer, pre-solder material, organic solderability preservative(OSP), chemical sputtering Ag layer or Ni/Pd layer.

Figure 3:
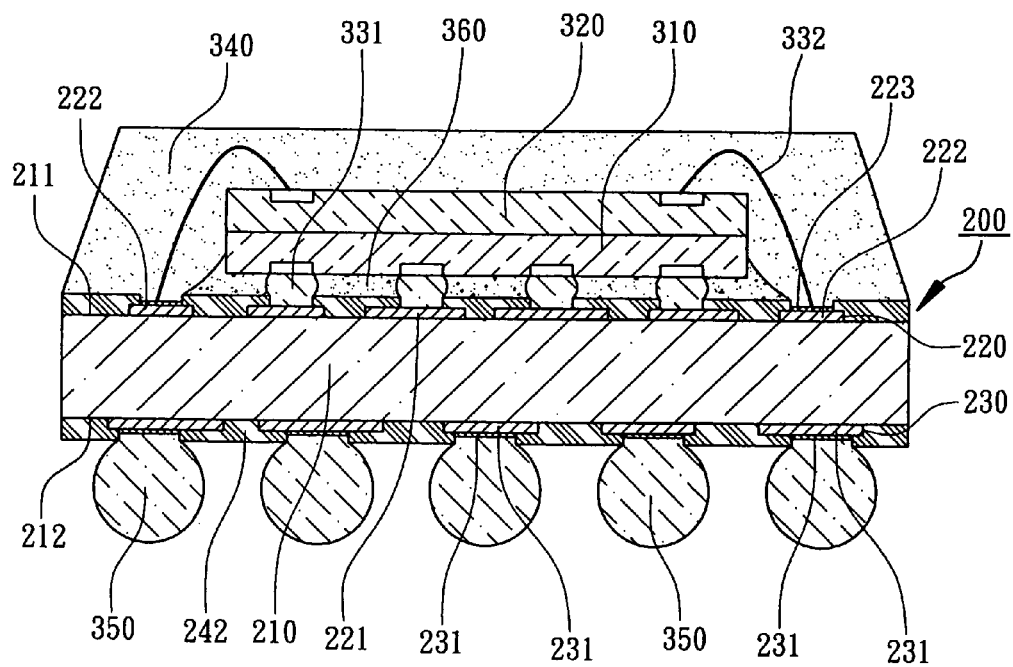
FIG. 3 is a cross-sectional view of the multi-chip package in accordance with the embodiment of the present invention.

Referring to FIG. 3, a multi-chip package utilizing the foregoing substrate 200 for both flip-chip bumping and wire-bonding applications comprises a package substrate 200, a bumping chip 310, a wire-bonding chip 320 stacked on the bumped chip 310, a plurality of bonding wires 332, a package body 340 and a plurality of solder balls 350. The bumped chip 310 has a plurality of bumps 331 on the active surface of the bumped chip 310 for flip-chip mounting to the bumping pads 221. After flip-chip mounting and reflow, the bumps 331 are reacted with the pre-solder material 224 on the bumping pads 221. The gold quantity in the bumps 331 is controlled less than 3.0 wt % so that Au embrittlement caused by $(Au_{1-x}Ni_x)Sn_4$ intermetallic would not happen at the mounting surface of the bumps 331. The back surface of the wire-bonding chip 320 is adhered to the back surface of the bumped chip 310. The bonding wires 332 connect the wire-bonding chip 320 to the wire-bonding pads 222 which are covered with the Ni/Au layer 223. A package body 340 is formed on the package substrate 200 to seal the bumped chip 310, the wire-bonding chip 320, and the bonding wires 332. Furthermore, the solder balls 350 are placed on the ball pads 231. Preferably, an underfilling material 360 is formed between the bumped chip 310 and the package substrate 200 to disperse the thermal stress of the bumps 331 due to the different thermal expansion coefficients between the bumped chip 310 and the package substrate 200.

Figure 4A:
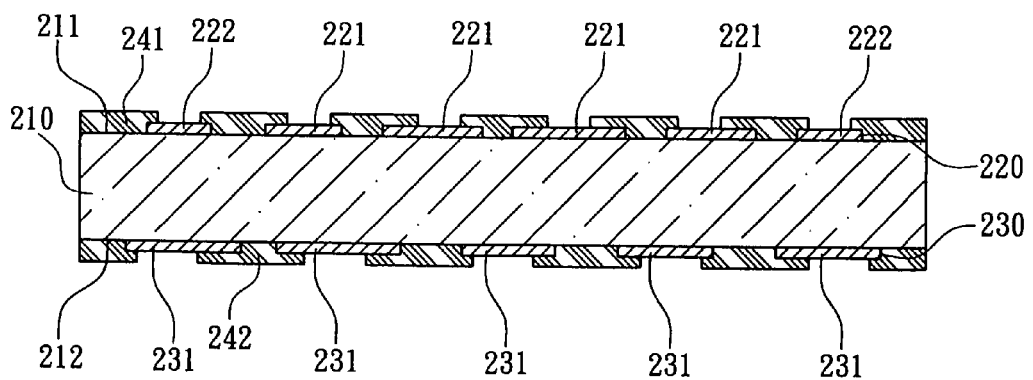
FIG. 4A to FIG. 4E are cross-sectional views of the multi-chip package substrate during the manufacturing process in accordance with the embodiment of the present invention.
Figure 4B:
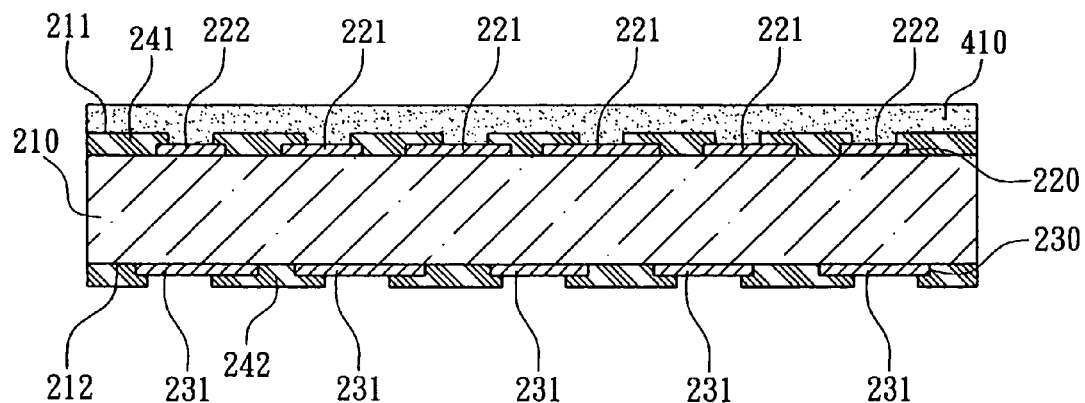
Figure 4C:
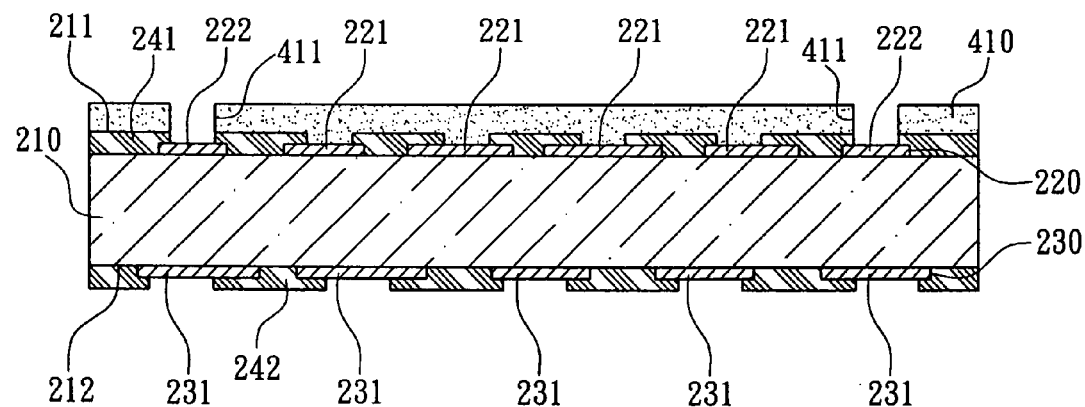
Figure 4D:
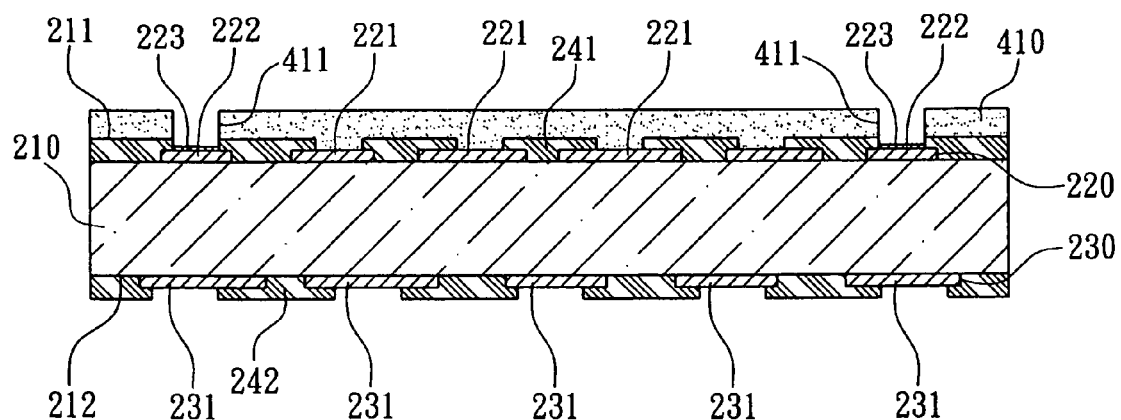
Figure 4E:
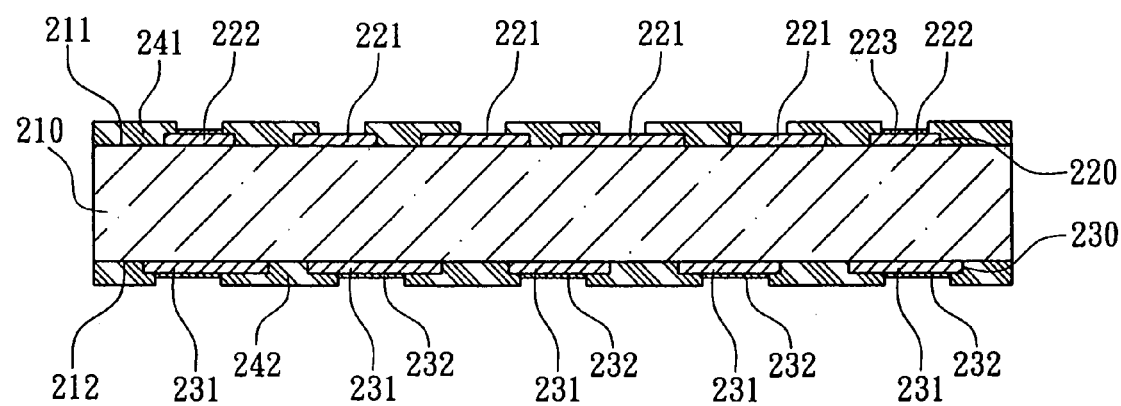

Initially referring to FIG. 4A, a substrate body 210 is provided in accordance with the manufacturing processes of the multi-chip package substrate for both flip-chip bumping and wire-bonding applications in the present invention. The substrate body 210 has a top surface 211 and a bottom surface 212. A top circuit layer 220 and a top solder mask layer 241 are formed on the top surface 211, and the top solder mask layer 241 exposes the plurality of bumping pads 221 and the plurality of wire-bonding pads 222. A bottom circuit layer 230 and a bottom solder mask layer 242 are formed on the bottom surface 212, and the bottom solder mask layer 242 exposes the plurality of ball pads 231. Next referring to FIG. 4B, using a gold pattern plating (GPP) technique a photoresist layer 410 is formed on the top surface 211 of the substrate body 210, such as attaching a photoimagable dry film. Then referring to FIG. 4C, using photolithography technique a plurality of the openings 411 are formed on the photoresist layer 410 to expose the wire-bonding pads 222 but the bumping pads 221 are covered by the photoresist layer 410 during forming a Ni/Au layer 223. Referring to FIG. 4D, the Ni/Au layer 223 is formed on the wire-bonding pads 222 by electroplating the substrate body 210 under coverage of the photoresist layer 410. Next referring to FIG. 4E, the photoresist layer 410 on the substrate body 210 is removed to expose the bumping pads 221 which are not covered by the Ni/Au layer 223. Finally, referring to FIG. 2, by means of printing or electroplating method a pre-solder material 224 is formed on the bumping pads 221 for mounting the bumps of the bumped chip. It is not necessary to form a Ni/Au layer 223 on the bumping pads 221 so that Au embrittlement would not happen at the bumping pads 221 so that the reliability of multi-chip stack package for both flip-chip bumping and wire-bonding applications will not be affected. Moreover, in this embodiment, a protective film 232 is also formed on the ball pads 231 and can be formed at the same time when forming the Ni/Au layer 223 on the wire-bonding pads 222 by electroplating. Otherwise, an anti-electroplating layer can be formed on the bottom surface 212 of the substrate body 210 prior to forming the Ni/Au layer 223 on the wire-bonding pads 222. Then, after forming the Ni/Au layer 223 on the wire-bonding pads 222, the protective film 232 can be formed through printing or other method.

The above description of embodiments of this invention is intended to be illustrated and not limited. Other embodiments of this invention will be obvious to those skilled in the art in view of the above disclosure.

What is claimed is:

1. The method for manufacturing a multi-chip package substrate, comprising:
    providing a substrate body having a top surface and a bottom surface;
    disposing a plurality of bumping pads and a plurality of wire-bonding pads on the top surface of the substrate body, the wire-bonding pads being arranged around the bumping pads;
    forming a Ni/Au layer on the wire-bonding pads; and
    forming a pre-solder material on the bumping pads, further comprising:
    forming a photoresist layer on the top surface of the substrate body, the photoresist layer having a plurality of openings to expose the wire-bonding pads, the bumping pads being covered by the photoresist layer during forming the Ni/Au layer.

2. The method in accordance with claim 1, wherein a plurality of ball pads are formed on the bottom surface of the substrate body.

3. The method in accordance with claim 2, wherein a protective film is formed on the ball pads.

4. The method in accordance with claim 3, wherein the protective film is selected from a group of a Ni/Au layer, a pre-solder material, an organic solderability preservative (OSP), a chemical sputtering Ag layer and a Ni/Pd layer.

* * * * *